US006893574B2

(12) United States Patent
Felton et al.

(10) Patent No.: US 6,893,574 B2
(45) Date of Patent: May 17, 2005

(54) MEMS CAPPING METHOD AND APPARATUS

(76) Inventors: Lawrence E. Felton, 15 Alexander Rd., Hopkinton, MA (US) 01748; Peter W. Farrell, 7 Fitchview Ave., Lunenburg, MA (US) 01462; Jing Luo, 3 Ryder La., Lexington, MA (US) 02421; David J. Collins, 8 Meadow Rd., Windham, NH (US) 03087; John R. Martin, 66 Summer St., Foxborough, MA (US) 02035; William A. Webster, 8 Kent St., Tewksbury, MA (US) 01876

(*) Notice: Subject to any disclaimer, the term of this patent is extended or adjusted under 35 U.S.C. 154(b) by 337 days.

(21) Appl. No.: 10/002,953

(22) Filed: Oct. 23, 2001

(65) Prior Publication Data

US 2003/0075794 A1 Apr. 24, 2003

(51) Int. Cl.[7] .............................. C23F 1/00; H01L 21/44; H01L 21/48; H01L 21/50
(52) U.S. Cl. ............................................. 216/2; 438/113
(58) Field of Search ................................ 216/2, 11, 17, 216/20, 24, 33, 36; 438/15, 33, 51, 55, 64, 66, 106, 110, 118, 126, 25, 113, 127; 257/433, 443, 466

(56) References Cited

U.S. PATENT DOCUMENTS

| | | | |
|---|---|---|---|
| 4,786,357 A | | 11/1988 | Campanelli et al. ......... 156/633 |
| 5,323,051 A | | 6/1994 | Adams et al. ............... 257/417 |
| 5,594,979 A | | 1/1997 | Borchelt et al. ............ 29/25.35 |
| 5,604,160 A | | 2/1997 | Warfield ...................... 437/209 |
| 5,798,557 A | | 8/1998 | Salatino et al. ............. 257/416 |
| 5,824,177 A | * | 10/1998 | Yoshihara et al. .......... 156/250 |
| 5,915,168 A | | 6/1999 | Salatino et al. ............. 438/110 |
| 6,555,417 B2 | * | 4/2003 | Spooner et al. ............. 438/113 |
| 2002/0088988 A1 | * | 7/2002 | Silverbrook .................. 257/99 |
| 2002/0090180 A1 | * | 7/2002 | Silverbrook .................. 385/92 |
| 2003/0092229 A1 | * | 5/2003 | Silverbrook ................ 438/200 |

FOREIGN PATENT DOCUMENTS

| | | | | |
|---|---|---|---|---|
| JP | 2001144117 A | * | 5/2001 | ........... H01L/21/56 |
| JP | 2001269900 A | * | 10/2001 | ............. B81C/1/00 |

OTHER PUBLICATIONS

Yoshio Awatani et al., "Damage Free Dicing Method for MEMS Devices" International Conference on Opical MEMs; Conferen Digest pp. 137–138, Aug. 20–23, 2002.*
Smith et al., Micromachined Packaging for Chemical Microsensors, IEEE Trans. Electron Devices, Jun. 1988, vol. 35, No. 6 (pp. 787–792, numbered 192–197).
Petersen et al., Silicon Fusion Bonding for Pressure Sensors, Rec. of the IEEE Solid–State Sensor and Actuator Workshop, 1988, pp. 144–147, numbered 209–212.
Rudolf et al., Silicon Microaccelerometer, Transducers'87, Rec. of the 4th Int. Conf. on Solid–State Sensors and Actuators, 1987, pp. 395–398, numbered 376–379.
Ko et al., Bonding Techniques for Microsensors, Micromachining and Micropackaging of Transducers, 1985, pp. 198–208.
Roylance et al., A Batch–Fabricated Silicon Accelerometer, IEEE Trans. Electron Devices, Dec. 1979, vol. ED–26, No. 12, pp. 1911–1917, numbered 352–358.

* cited by examiner

*Primary Examiner*—Gregory Mills
*Assistant Examiner*—Roberts Culbert (57) ABSTRACT

A MEMS capping method and apparatus uses a cap structure on which is formed a MEMS cavity, a cut capture cavity, and a cap wall. The cap wall is essentially the outer wall of the MEMS cavity and the inner wall of the cut capture cavity. The cap structure is bonded onto a MEMS structure such that the MEMS cavity covers protected MEMS components. The cap structure is trimmed by cutting through to the cut capture cavity from the top of the cap structure without cutting all the way through to the MEMS structure.

14 Claims, 6 Drawing Sheets

MEMS CAPPING METHOD AND APPARATUS

FIELD OF THE INVENTION

The present invention relates generally to Micro-Electromechanical System (MEMS), and more particularly to a MEMS capping method and apparatus.

BACKGROUND OF THE INVENTION

Generally speaking, a Micro-Electromechanical System (MEMS) is a highly miniaturized device having both electrical and mechanical components. MEMS devices are typically fabricated on or from a substrate material, such as silicon or polysilicon. Various electrical and mechanical structures are formed using a variety of techniques.

The mechanical structures of the MEMS are typically very fragile, and can be easily damaged. Furthermore, the mechanical structures of the MEMS are typically very sensitive, and can be easily impeded. Many things can affect MEMS performance, including dirt, moisture, and even static electricity.

Therefore, a cap is typically placed over substantially all of the MEMS mechanical and electrical components in order to protect the mechanical and electrical components of the MEMS. The cap typically includes a cavity for protecting the MEMS structures. For convenience, this cavity is referred to hereinafter as the MEMS cavity. The cap is bonded onto the MEMS in such a way that the MEMS structures to be protected are positioned within the MEMS cavity.

MEMS devices are typically produced by forming the electrical and mechanical components for multiple MEMS devices on a single MEMS wafer, forming the MEMS cavities for multiple caps on a single cap wafer, bonding the cap wafer onto the MEMS wafer, and mechanically cutting through both the MEMS wafer and the cap wafer to separate the individual MEMS devices. The resulting caps cover substantially all of the MEMS electrical components (except, perhaps, electrical bond pads for making electrical connections to the MEMS device). This is due in part because the separation of the individual MEMS devices must be done in such a way that the mechanical cutting does not cut through the MEMS electrical components.

SUMMARY OF THE INVENTION

In accordance with one aspect of the invention, a MEMS capping method and apparatus uses a cap structure on which is formed a MEMS cavity, a cut capture cavity, and a cap wall. The cap wall is essentially the outer wall of the MEMS cavity and the inner wall of the cut capture cavity. The cap structure is bonded onto a MEMS structure such that the MEMS cavity covers protected MEMS components. The cap structure is trimmed by cutting through to the cut capture cavity from the top of the cap structure without cutting all the way through to the MEMS structure.

DETAILED DESCRIPTION OF A PREFERRED EMBODIMENT

In an embodiment of the present invention, cut capture cavities are formed along with the MEMS cavity in the cap. After being bonded onto the MEMS structure, the cap is trimmed by cutting through to the cut capture cavities from the top of the cap structure. In this way, the cutting apparatus does not cut all the way through to the MEMS structure.

One advantage of this capping technique is that it reduces potential damage to the MEMS electrical components by keeping the cutting apparatus away from the MEMS electrical components. The MEMS electrical components can still be damaged, for example, by shavings produced by the cutting apparatus as it cuts through the cap material. This damage can be further reduced, for example, by filling the cut capture cavities with a protective material, such as wax, prior to cutting and removing the protective material after cutting.

Another advantage of this capping technique is that it does not require the cap to cover substantially all of the MEMS components. In many applications, it is necessary or desirable to leave certain MEMS components uncapped. For example, it may be necessary or desirable to leave bond pads, laser trimmable resistors, test probe pads, and other MEMS components uncapped so that they can be accessed in subsequent processes.

Figure 1:
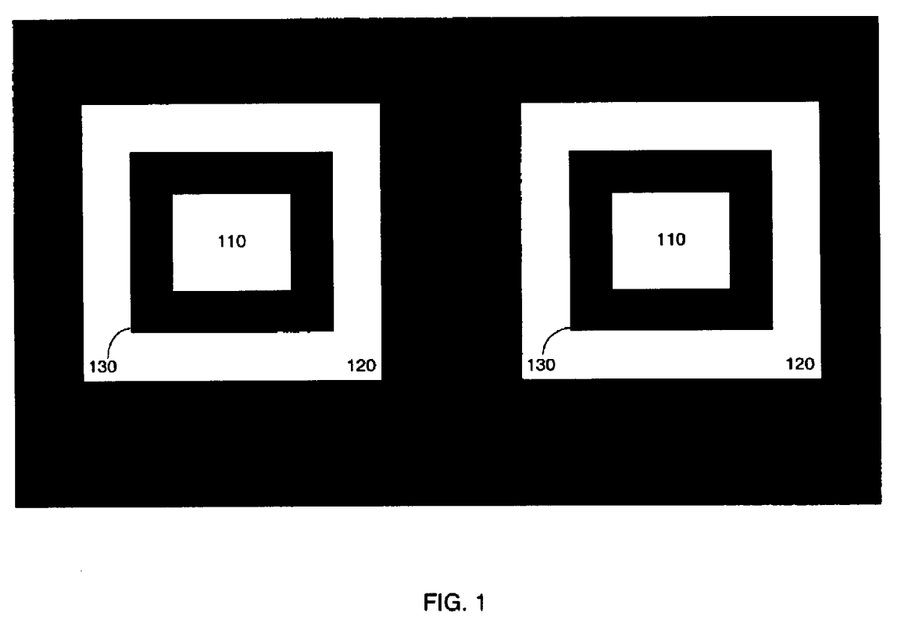
FIG. 1 is a block diagram showing a representation of a cap structure having a bottom side with a number of MEMS cavities, a number of cut capture cavities, and a number of cap walls in accordance with an embodiment of the present invention.

FIG. 1 shows a representation of a cap structure 100 having a bottom side with a number of MEMS cavities 110, a number of cut capture cavities 120, and a number of cap walls 130. The cap walls 130 are essentially the outside walls of the MEMS cavities 110 and the inside walls of the cut capture cavities 120. It should be noted that the present invention is in no way limited to any particular shape or formation of MEMS cavities 110 and cut capture cavities 120. It should also be noted that the cap structure 100 is typically a cap wafer from which a large number of caps are formed. For convenience, only two caps are shown.

Figure 2:
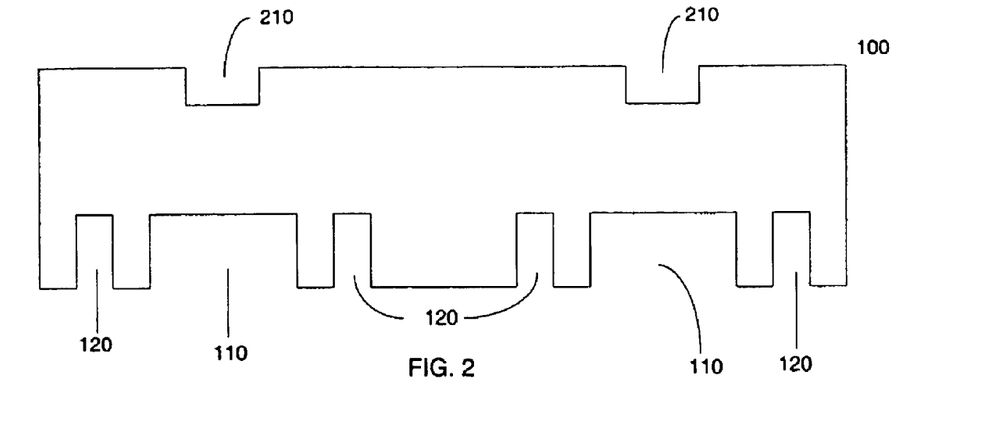
FIG. 2 is a cross-sectional view of the cap structure showing the MEMS cavities, the cut capture cavities, and the cap walls in accordance with an embodiment of the present invention.

FIG. 2 is a cross-sectional view of the cap structure 100 showing the MEMS cavities 110, the cut capture cavities 120, and the cap walls 130. Also shown are alignment keys 210 that are typically formed on the top of the caps. The alignment keys 210 are typically formed by etching alignment key cavities into the top of the cap material. The alignment keys 210 are typically used for aligning the cap structure 100 with a MEMS structure to aid in bonding the cap structure 100 onto the MEMS structure. Alignment key cavities are typically also formed in the MEMS structure to aid in alignment.

The MEMS cavities 110, cut capture cavities 120, and cap walls 130 can be formed on the bottom of the cap structure 100 using any of a variety of techniques, and the present invention is in no way limited to any particular technique for forming the MEMS cavities 110, cut capture cavities 120, and cap walls 130. In one exemplary embodiment of the present invention, the MEMS cavities 110, cut capture cavities 120, and cap walls 130 are formed on the bottom side of the cap structure 100 by recessing the MEMS cavities 110 and the cut capture cavities 120 into the bottom side of the cap structure 100 (e.g., using an etching technique), leaving the cap walls 130 raised above the MEMS cavities 110 and cut capture cavities 120. In another exemplary embodiment of the present invention, the MEMS cavities 110, cut capture cavities 120, and cap walls 130 are formed by forming raised cap walls 130 onto the bottom side of the cap structure 100 (e.g., using a material deposition technique), thereby forming the recessed MEMS cavities 110 and cut capture cavities 120.

In an exemplary embodiment of the present invention, the cap wafer is typically fabricated from double sided polished silicon wafers having a thickness between 400 and 700 um. The alignment keys are etched into the top of the cap wafer. The MEMS cavities 110 and cut capture cavities 120 are etched into the bottom of the wafer using a deep reactive ion etch process. The MEMS cavities 110 and cut capture cavities 120 are typically etched to a depth between 100 and 150 microns. The cut capture cavities 120 are typically formed as "picture frames" around the MEMS cavities 110. The cap walls 130, which are the unetched areas between the MEMS cavities 110 and the cut capture cavities 120, are typically between 125 and 150 um wide.

After the MEMS cavities 110 and cut capture cavities 120 are formed, a bonding material is typically formed onto the bottom of the cap walls 130. The bonding material is used in subsequent processes to bond the caps onto the MEMS devices. The present invention is in no way limited to any particular bonding material or to any particular technique for forming the bonding material onto the bottom of the cap walls 130. In an exemplary embodiment of the present invention, the bonding material is a glass material that is formed by screen printing a glass frit onto the bottom of the cap walls 130, burning off the organic compounds of the glass frit, and glazing the remaining glass material. Glass is a good bonding material because it provides a hermetic seal and it is not electrically conductive. Other exemplary bonding materials include polymeric materials (thermoplastics and thermosets) and solders, to name but a few.

In an exemplary embodiment of the present invention, the cap wafer is bonded to the MEMS wafer with a borosilicate glass. The glass is typically one that is commonly known as Ferro 11-036. The glass is typically purchased as a paste, which is screen-printed onto the bottom of the cap walls 130 of the cap wafer. The width of the screen-printed glass is typically 25 microns less than the width of the cap walls 130. The thickness of the glass paste after screen-printing is approximately 20–30 um. The glass paste is subjected to a glazing process to burn off the organic binder materials and consolidate the glass by melting it. The glaze process consists of approximately 10 minutes at 420 C. in clean dry air. After glazing, the thickness of the glass is approximately 12 um.

Figure 3:
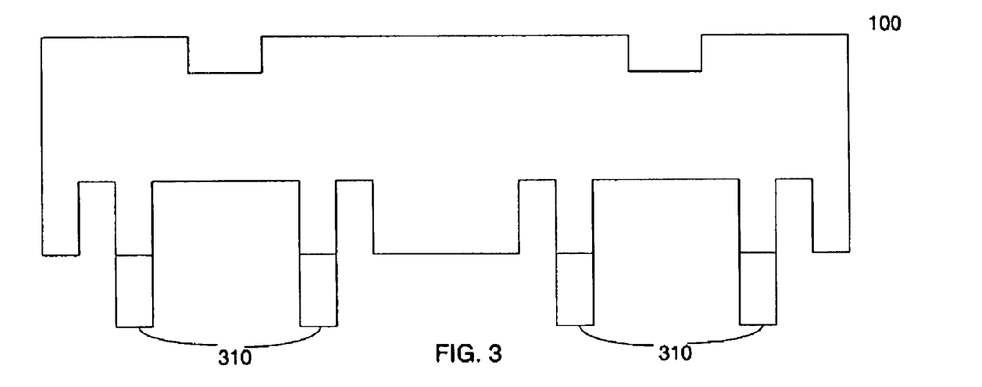
FIG. 3 is a cross-sectional view of the cap structure showing the bonding material formed onto the bottom of the cap walls in accordance with an embodiment of the present invention.

FIG. 3 is a cross-sectional view of the cap structure 100 showing the bonding material 310 formed onto the bottom of the cap walls 130.

After the bonding material is formed onto the bottom of the cap walls 130, the cap structure 100 is bonded to the MEMS structure. This is typically done under pressure at a process temperature that is high enough to melt the glass bonding material. This produces a hermetic seal around the capped MEMS components.

In an exemplary embodiment of the present invention, the bonding is completed in a commercially available wafer bonding system. In order to bond the cap structure onto the MEMS structure, the cap and MEMS wafers are aligned, brought into contact and subjected to a temperature of 450 C. with an applied load of 3 atmospheres for approximately 10 minutes. The chamber ambient typically contains at least 10 ppm of oxygen.

Figure 4:
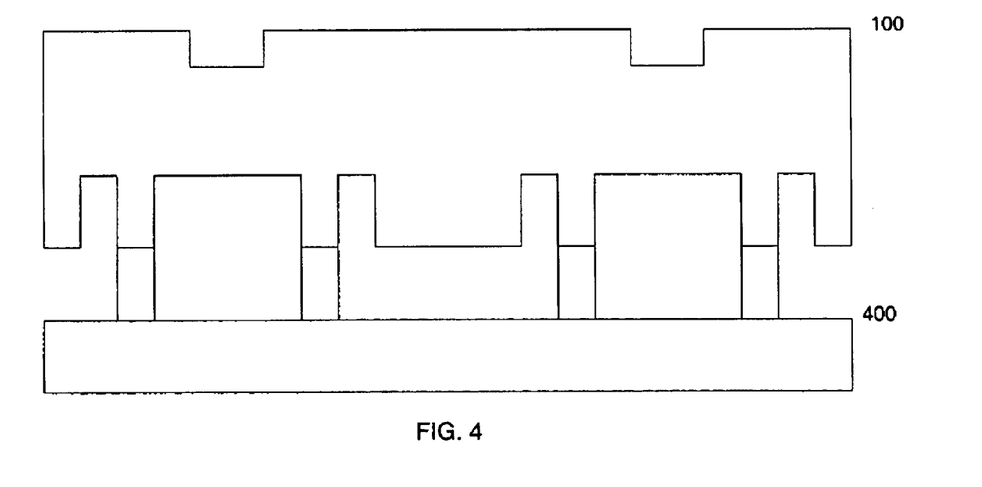
FIG. 4 is a cross-sectional view of the cap structure bonded to the MEMS structure in accordance with an embodiment of the present invention.

FIG. 4 is a cross-sectional view of the cap structure 100 bonded to the MEMS structure 400.

After the cap structure 100 is bonded to the MEMS structure 400, the cut capture cavities 120 are typically filled with a protective material, such as wax, in order to protect exposed MEMS components from damage during subsequent cutting (described below). The protective material can be introduced into the cut capture cavities 120, for example, using an injection or capillary filling technique. The present invention is in no way limited to any particular protective material or to any particular technique for filling the cut capture cavities 120 with the protective material.

In an exemplary embodiment of the present invention, the cut capture cavities 120 are filled with wax using a capillary filling technique. Specifically, after bonding, the bonded wafer stack is mounted on a standard wafer dicing film frame using a UV releasable dicing tape. A metal ring with an inner diameter larger than the wafer and an outer diameter narrower than the inside of the film frame is centered around the wafers. Approximately 15–20 grams of paraffin wax is placed inside the outer ring on the dicing tape. The entire film frame is placed in a vacuum oven. The pressure inside of the oven is reduced to less than 15 torr and the temperature inside the oven is increased to 80 C. for 90 minutes. At the end of this time, the pressure in the chamber is returned to atmospheric pressure and the wafers are returned to room temperature. The wafer is removed from the film frame. Any wax on the top of the cap wafer or the bottom of the MEMS wafer is removed with an alcohol wipe and the wafer stack is placed on a second, identical film frame.

Figure 5:
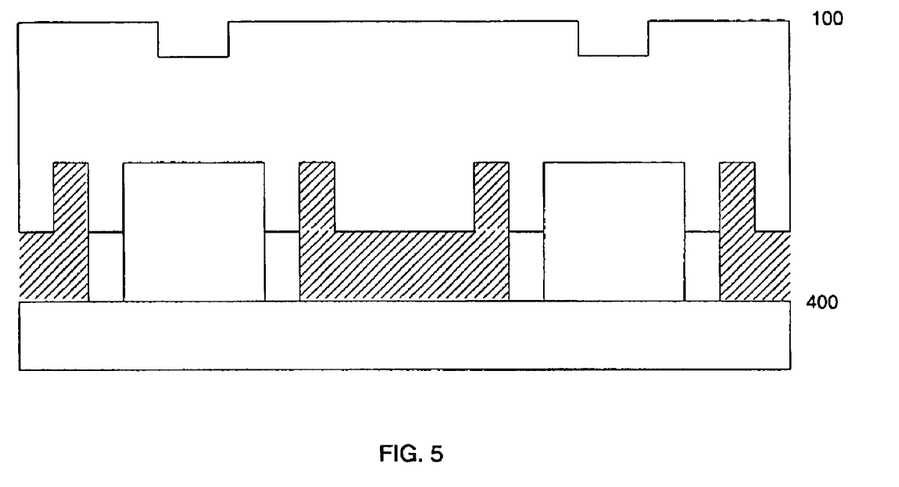
FIG. 5 is a cross-sectional view of the cap structure bonded to the MEMS structure, with the cut capture cavities filled with a protective material in accordance with an embodiment of the present invention.

FIG. 5 is a cross-sectional view of the cap structure 100 bonded to the MEMS structure 400, with the cut capture cavities 120 filled with a protective material 510.

After the cut capture cavities 120 are filled with the protective material 510, the caps are trimmed by cutting through to the cut capture cavities 120 from the top of the cap structure 100 so that the cutting apparatus does not cut all the way through to the MEMS structure 400. The caps can be trimmed using a variety of techniques, including precision cutting or grinding techniques, laser techniques, or etching techniques. The present invention is in no way limited to any particular technique for cutting through to the cut capture cavities 120.

In an exemplary embodiment of the present invention, the caps are trimmed using a precision grinding technique. Specifically, the caps are trimmed by grinding through the cap wafer from the top-side to the cut capture cavities 120. Alignment is achieved with the alignment keys fabricated in the top of the cap wafer. The grinding wheel is selected to be about 150 um wide. During cutting, the center of the wheel is aligned to the center of the cut capture cavities 120. The cut depth is selected so that the dicing blade cuts approximately 25 um beyond the bottom of the cut capture cavities 120. The wheel rotates at a speed of approximately 12,000 RPM and the work speed is approximately 12 inches/minute. Water with a standard surfactant is used for lubrication and cooling.

After the caps are trimmed, the excess cap material is removed. Because the caps are not cut through their entire depth, it is common for the excess cap material to come off in one contiguous piece, making it easy to remove the excess cap material. The residual protective material is also removed using an appropriate cleaning technique.

In an exemplary embodiment of the present invention, the wafer is removed from the film frame and placed in a commercially available solvent for paraffin wax, such as a solvent commonly known as Opticlear®, for a period of at least 2 hours. During this period, the portions of the cap wafer that are not bonded to the product wafer are removed from the capped assembly. Next, the wafer is placed in an ultrasonic bath of Opticlear S® that is heated to 70 C. for two hours. The wafer is then rinsed in isopropanol for five minutes and in deionized water for five minutes. Finally the wafer is washed in a spin rinse drier for final cleaning.

Figure 6:
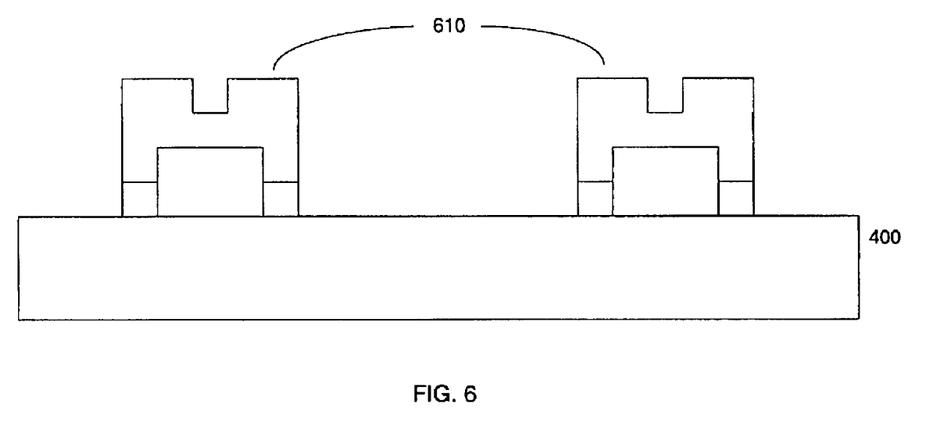
FIG. 6 is a cross-sectional view showing the intact MEMS structure with individual caps bonded appropriately over the MEMS components in accordance with an embodiment of the present invention.

It should be noted that, following this trimming of the caps, the MEMS structure 400 is intact, with individual caps bonded appropriately over the MEMS components.

FIG. 6 is a cross-sectional view showing the intact MEMS structure 400 with individual caps 610 bonded appropriately over the MEMS components (not shown for convenience).

The capped MEMS structure 400 can be subsequently cut into individual capped MEMS devices.

Figure 7:
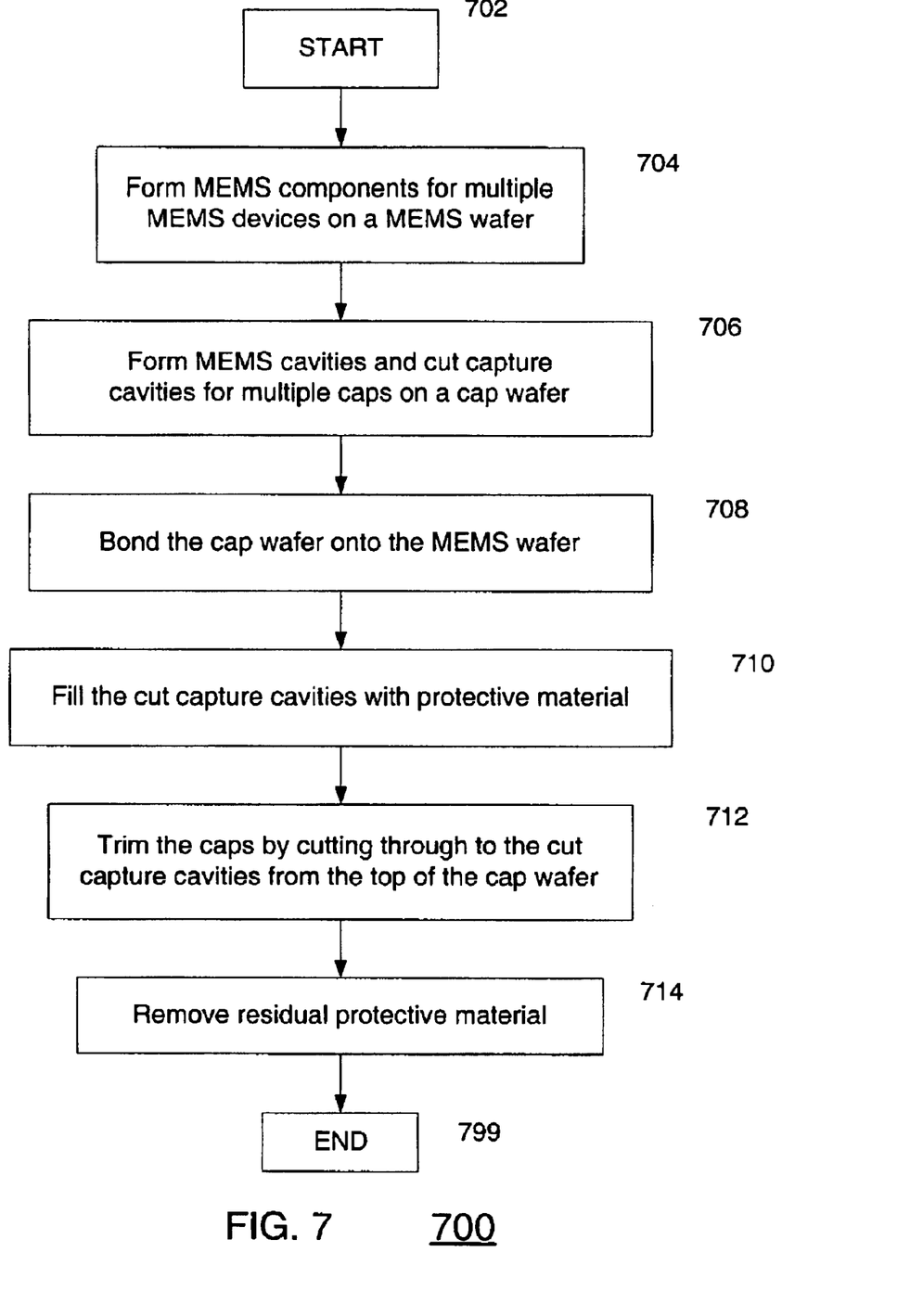
FIG. 7 is a process diagram describing an exemplary process for producing capped MEMS devices in accordance with an embodiment of the present invention.

FIG. 7 is a process diagram describing an exemplary process 700 for producing capped MEMS devices in accordance with an embodiment of the present invention. Beginning in block 702, the MEMS components for multiple MEMS devices are formed on a MEMS wafer, in block 704. MEMS cavities and cut capture cavities for multiple caps are formed on a cap wafer, in block 706. The cap wafer is bonded onto the MEMS wafer, in block 708. The cut capture cavities are typically filled with a protective material, in block 710. The caps are trimmed, in block 712, by cutting through to the cut capture cavities from the top of the cap wafer. Residual protective material is removed, in block 714. The process terminates in block 799.

Figure 8:
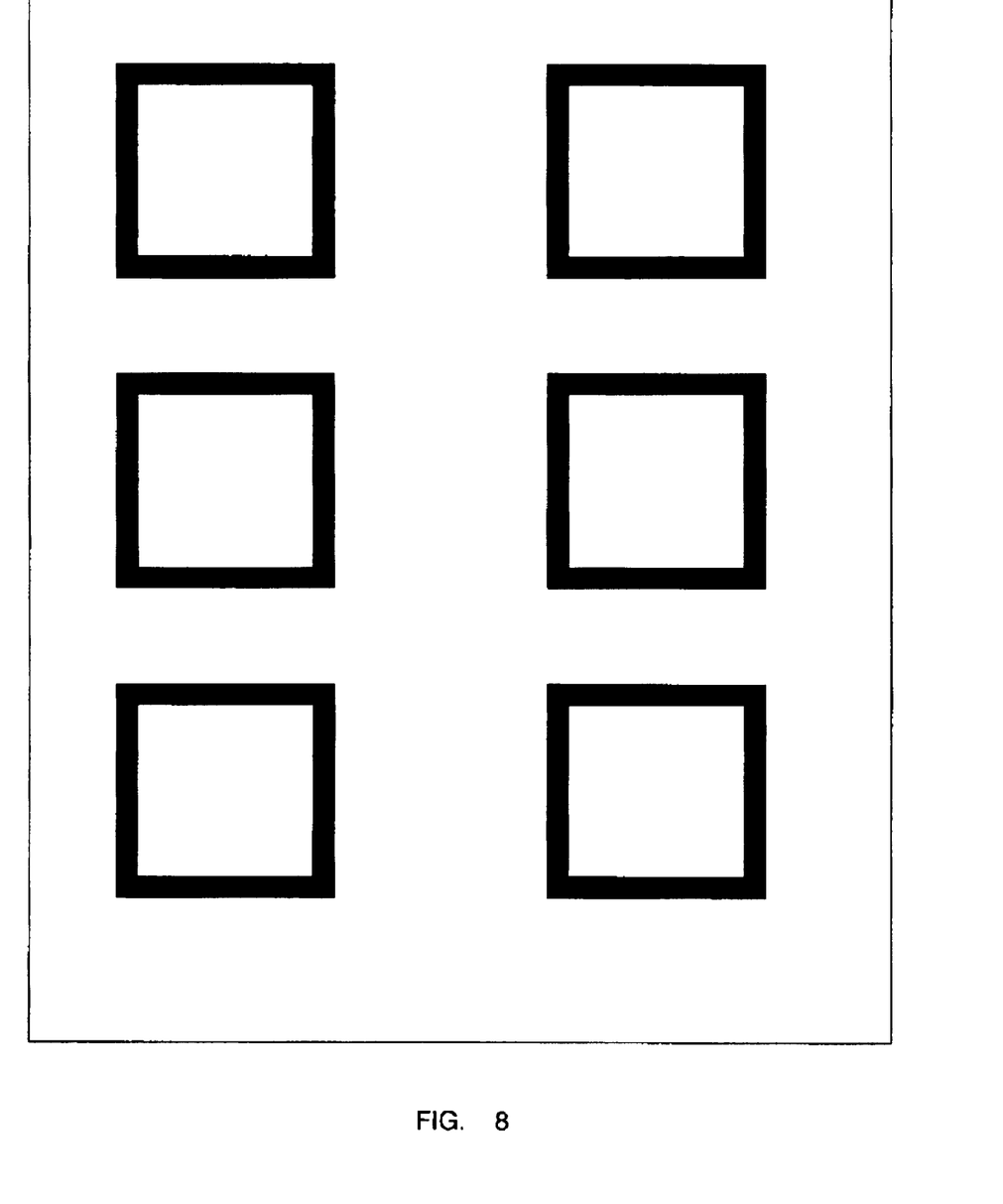
Figure 9:
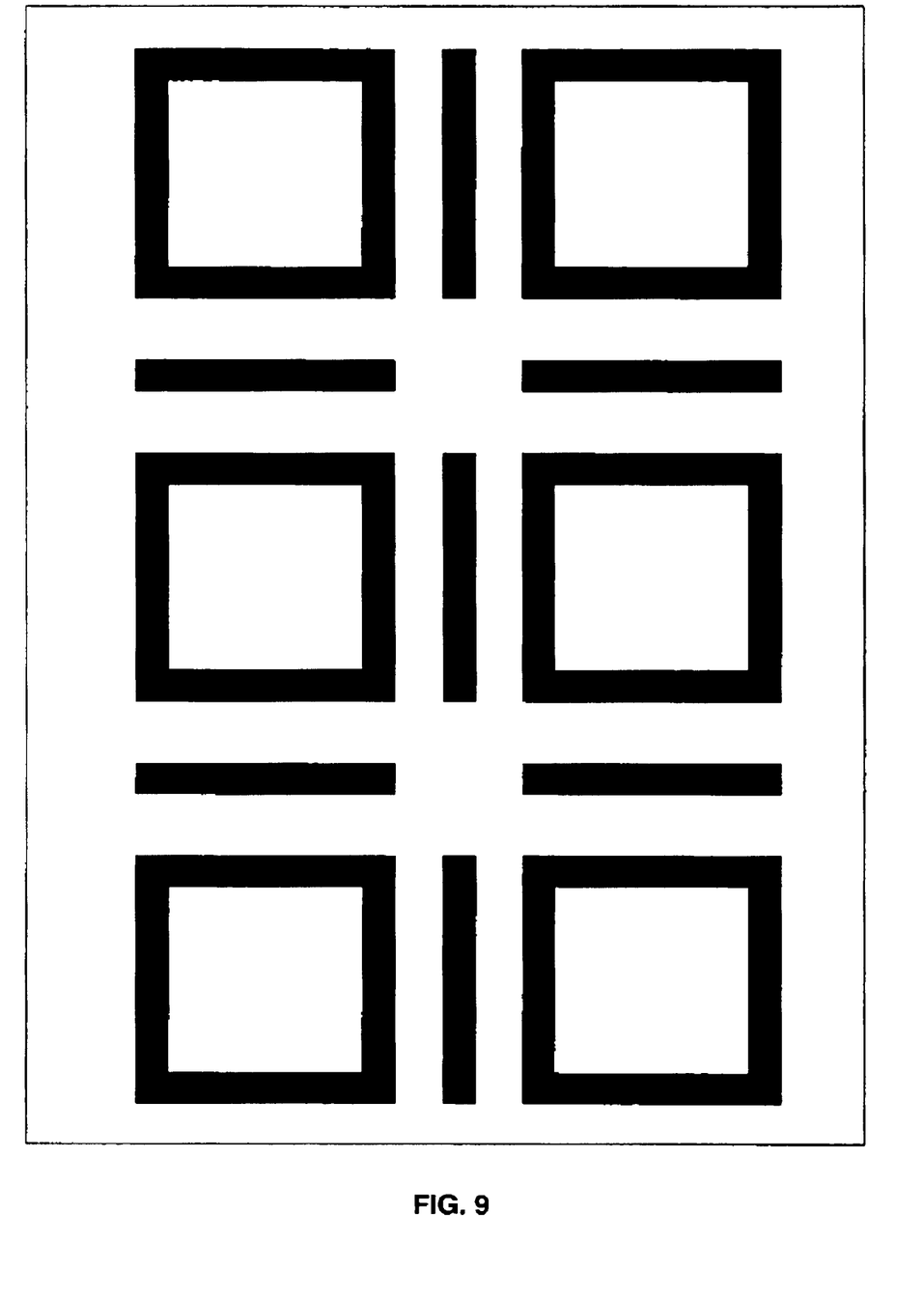

It should be noted that the present invention is in no way limited to any particular shape or formation of MEMS cavities 110 or cut capture cavities 120. FIG. 8 shows one exemplary alternative cap structure 800. FIG. 9 shows another exemplary alternative cap structure 900.

It should be noted that the cap structure 100 is an embodiment of the present invention unto itself.

Thus, the present invention may be embodied as a method for capping a Micro-Electromechanical System (MEMS) device. The method involves forming a cap structure having a bottom side with at least a MEMS cavity, a cut capture cavity surrounding the MEMS cavity, and a cap wall, the cap wall forming an outer wall of the MEMS cavity and an inner wall of the cut capture cavity; bonding the cap wall onto a MEMS structure; and cutting through to the cut capture cavity from a top side of the cap structure to form a cap. Forming the cap structure may involve forming the MEMS cavity and the cut capture cavity into the bottom side of the cap structure, for example, by etching the MEMS cavity and the cut capture cavity into the bottom side of the cap structure. Forming the cap structure may involve forming the cap wall onto the bottom side of the cap structure with the cap wall forming the outside wall of the MEMS cavity and the inside wall of the cut capture cavity, for example, by depositing a cap wall material onto the bottom side of the cap structure to form the cap wall. Bonding the cap wall onto the MEMS structure may involve applying a bonding material to a bottom side of the cap wall and bonding the bottom side of the cap wall onto the MEMS structure. The bonding material may be a glass material that is applied to the bottom side of the cap wall by screen printing a glass frit material onto the bottom side of the cap wall, burning off organic compounds of the glass frit material, and glazing the remaining glass frit material to form the glass material, in which case the bottom side of the cap wall may be bonded onto the MEMS structure by bonding the bottom side of the cap wall onto the MEMS structure under pressure at a temperature sufficient to melt the glass material. The cut capture cavity may be filled with a protective material such as wax prior to cutting through to the cut capture cavity from the top side of the cap structure to form the cap in order to protect the uncapped MEMS components, in which case residual protective material is removed after cutting through to the cut capture cavity from a top side of the cap structure to form the cap. Cutting through to the cut capture cavity from the top side of the cap structure to form the cap may involve cutting through to the cut capture cavity from the top side of the cap structure any of a variety of techniques, including a precision cutting technique, a precision grinding technique, a laser technique, or an etching technique. The cap structure may be composed of a silicon material.

The present invention may also be embodied as an apparatus for capping a Micro-Electromechanical System (MEMS) device, the apparatus comprising a bottom side with at least a MEMS cavity, a cut capture cavity surrounding the MEMS cavity, and a cap wall, the cap wall forming an outer wall of the MEMS cavity and an inner wall of the cut capture cavity. The MEMS cavity and cut capture cavity may be recessed into the bottom side, or the cap wall may be built upon the bottom side so as to form the outside wall of the MEMS cavity and the inside wall of the cut capture cavity.

The present invention may also be embodied as a capped Micro-Electromechanical System (MEMS) device produced by the process of forming a cap structure having a bottom side with at least a MEMS cavity, a cut capture cavity surrounding the MEMS cavity, and a cap wall, the cap wall forming an outer wall of the MEMS cavity and an inner wall of the cut capture cavity; bonding the cap wall onto a MEMS structure; and cutting through to the cut capture cavity from a top side of the cap structure to form a cap.

The present invention may be embodied in other specific forms without departing from the true scope of the invention. The described embodiments are to be considered in all respects only as illustrative and not restrictive.

What is claimed is:

1. A method for capping a Micro-Electromechanical System (MEMS) device, the method comprising:

forming a cap structure having a bottom side with at least a MEMS cavity, a cut capture cavity surrounding the MEMS cavity, and a cap wall, the cap wall forming an outer wall of the MEMS cavity and an inner wall of the cut capture cavity;

bonding the cap wall onto a MEMS structure;

filling the cut capture cavity with a protective material; and cutting through to the cut capture cavity from a top side of the cap structure to form a cap.

2. The method of claim 1, wherein forming the cap structure comprises:

forming the MEMS cavity and the cut capture cavity into the bottom side of the cap structure.

3. The method of claim 2, wherein forming the MEMS cavity and the cut capture cavity into the bottom side of the cap structure comprises:

etching the MEMS cavity and the cut capture cavity into the bottom side of the cap structure.

4. The method of claim 1, wherein forming the cap structure comprises:

forming the cap wall onto the bottom side of the cap structure, the cap wall forming the outside wall of the MEMS cavity and the inside wall of the cut capture cavity.

5. The method of claim 4, wherein forming the cap wall onto the bottom side of the cap structure comprises:

depositing a cap wall material onto the bottom side of the cap structure to form the cap wall.

6. The method of claim 1, wherein bonding the cap wall onto the MEMS structure comprises:

applying a bonding material to a bottom side of the cap wall; and bonding the bottom side of the cap wall onto the MEMS structure.

7. The method of claim 6, wherein the bonding material comprises a glass material.

8. The method of claim 7, wherein applying the bonding material to the bottom side of the cap wall comprises:

screen printing a glass fit material onto the bottom side of the cap wall;

burning off organic compounds of the glass frit material; and glazing the remaining glass fit material to form the glass material.

9. The method of claim 7, wherein bonding the bottom side of the cap wall onto the MEMS structure comprises:

bonding the bottom side of the cap wall onto the MEMS structure under pressure at a temperature sufficient to melt the glass material.

10. The method of claim 1, wherein the cut capture cavity is filled with the protective material after the cap wall is bonded onto the MEMS structure.

11. The method of claim 1, wherein the protective material comprises a wax material.

12. The method of claim 1, further comprising:

removing residual protective material after cutting through to the cut capture cavity from a top side of the cap structure to form the cap.

13. The method of claim 1, wherein cutting through to the cut capture cavity from the top side of the cap structure to form the cap comprises cutting through to the cut capture cavity from the top side of the cap structure using at least one of:

a precision cutting technique;

a precision grinding technique;

a laser technique; and an etching technique.

14. The method of claim 1, wherein the cap structure comprises a silicon material.

* * * * *

UNITED STATES PATENT AND TRADEMARK OFFICE
CERTIFICATE OF CORRECTION

PATENT NO. : 6,893,574 B2
DATED : May 17, 2005
INVENTOR(S) : Lawrence E. Felton et al.

It is certified that error appears in the above-identified patent and that said Letters Patent is hereby corrected as shown below:

<u>Title page,</u>
Insert Item:
-- Assignee: Analog Devices, Inc., Norwood, MA (US) --
Insert Item:
-- *Attorney, Agent, or Firm*: Bromberg & Sunstein LLP --

<u>Column 7,</u>
Line 28, replace "fit" with -- frit --.

<u>Column 8,</u>
Line 1, replace "fit" with -- frit --.

Signed and Sealed this

Second Day of August, 2005

JON W. DUDAS
*Director of the United States Patent and Trademark Office*